United States Patent [19]
Eastman

[11] Patent Number: 5,461,532
[45] Date of Patent: Oct. 24, 1995

[54] ELECTRONIC PULSE TRANSFORMER

[75] Inventor: Gary B. Eastman, Plano, Tex.

[73] Assignee: Texas Instruments Incorporated, Dallas, Tex.

[21] Appl. No.: 261,025

[22] Filed: Jun. 14, 1994

Related U.S. Application Data

[62] Division of Ser. No. 182,538, Jan. 11, 1994, Pat. No. 5,365,421, which is a continuation of Ser. No. 990,227, Dec. 14, 1992, abandoned.

[51] Int. Cl.[6] .................................................. H02M 3/337
[52] U.S. Cl. ................................ 361/56; 361/35; 361/91
[58] Field of Search ............................ 361/56, 91, 118, 361/119, 111, 35; 363/17, 21, 20, 56, 70, 71

[56] References Cited

U.S. PATENT DOCUMENTS 4,063,307 12/1977 Stephens ..................................... 363/21
4,876,635 10/1989 Park et al. .................................. 363/56

*Primary Examiner*—Marc S. Hoff
*Assistant Examiner*—S. Jackson
*Attorney, Agent, or Firm*—Rene' E. Grossman; Richard L. Donaldson

[57] ABSTRACT

A pulse transformer circuit which comprises a transformer core having a plurality of individual primary windings and a secondary winding, a plurality of preferably single turn primary circuits, each primary circuit coupled to a different one of the primary windings. Each primary circuit comprises a switch in series with the primary winding, a capacitor coupled across the primary winding and the switch and a voltage source coupled across the capacitor. A load circuit is coupled across said secondary winding. The switch is a semiconductor device having a control electrode and a current carrying path coupled to the primary winding and controlled by the control electrode. A clamp circuit can be coupled to the load circuit to minimize voltage overshoot in the secondary winding. The clamp circuit includes a voltage source of opposite polarity to the direction of voltage overshoot coupled through a unidirectional current conducting device between the load circuit and a source of reference potential and an RC circuit connected in parallel with the voltage source of opposite polarity to the direction of the voltage overshoot and the unidirectional current conducting device. A second embodiment of the clamp circuit includes an RC circuit coupled through a unidirectional current conducting device between the load circuit and a source of reference potential, the RC circuit including a capacitor and a variable resistance circuit in parallel with the capacitor.

5 Claims, 3 Drawing Sheets

ELECTRONIC PULSE TRANSFORMER

This application is a Division of application Ser. No. 08/182,538, filed Jan. 11, 1994 now U.S. Pat. No. 5,365,421 which is a continuation of Ser. No. 07/990,227, filed Dec. 14, 1992, now abandoned.

BACKGROUND OF THE INVENTION

1. Field of the Invention

This invention relates to a circuit capable of providing high speed, high peak power pulses of digitally controlled pulse width using solid state power MOSFET switch modules in conjunction with a high speed pulse transformer.

2. Brief Description of the Prior Art

Travelling wave tubes, which are microwave amplifiers, have generally been powered in the prior art by hydrogen thyratrons. Hydrogen thyratrons are voltage-current switches which, in response to an input pulse, turn on and transfer energy from a storage device, known as a pulse forming network, to a load device, generally a travelling wave tube. A major problem inherent in hydrogen thyratrons is that they have an advertised life of about 300 hours, this seriously affecting the mean time between failures (MTBF) of systems in which they are included. Hydrogen thyratrons also require complex trigger and heater circuits. It is therefore impossible to have a 6σ type of transmitter using a hydrogen thyratron. Furthermore, in order to provide more than one possible magnitude of pulse width, a bank of capacitors is required for each desired pulse width and a high voltage relay and physical switching to the selected capacitor bank is required at the appropriate time to provide the desired pulse width. The capacitors and relays further present reliability problems and tuning of the capacitor banks causes problems in providing the desired spectrum, pulse widths and pulse shapes. Accordingly, both reliability and labor intensity are a problem in the case of hydrogen thyratrons.

In order to alleviate these problems, hard tube modulators have been considered in the past as a substitute. The problem with hard tube modulators is that the voltage of the transmitter is about 38,000 to 40,000 volts and causes emission of a substantial amount of x-rays. Since the device is generally used in airborne radar, the use of heavy lead shielding to shield the x-rays is not a practically available option. There are also other problems inherent in the use of such high voltages. Accordingly, the hard tube modulators are not a practical alternative to the hydrogen thyratron.

SUMMARY OF THE INVENTION

In accordance with the present invention, the above noted problems are minimized and there is provided a pulse transformer having relatively low voltage operation which is solid state and performs the functions of hydrogen thyratrons without the above described problems. The hydrogen thyratron is replaced with power MOSFET switch modules which increase the MTBF of the transmitter by a factor of about five.

Briefly, the prior art line type pulse modulator is replaced by a bank of parallel field effect transistors (FETs) which operate as switches. Each FET is coupled in series with a different single primary turn or winding of a pulse transformer to provide the equivalent of plural such single primary turns or windings, one turn associated with each FET. While a single turn primary winding is preferred, windings with more than one turn can be used, however a relatively larger voltage will then be required for the same number of secondary winding turns. Each switch and primary turn series circuit has a capacitor coupled thereacross to store charge and a DC voltage source coupled across each capacitor. The pulse transformer includes a toroidal core to which each of the single primary windings is coupled. It follows that the magnetic flux developed in the toroidal core is the sum of the flux developed by each of the single primary windings when the switch associated with each primary winding is closed. The total flux developed in the core provides the energy developed in the secondary winding coupled to the toroidal core. In this manner, with, for example, 300 volts across each capacitor at the input to each of five primary windings of the transformer, there is provided about 40,000 volts at the transformer output or across the secondary winding with 130 turns in the secondary winding when all of the switches are simultaneously closed.

Since only a small portion (generally about 2 to 5%, depending upon the duration of capacitor discharge caused by switch closing) of the charge on the capacitors across the primary windings is used during each discharge, the duration of each pulse or pulse width produced by the transformer can be adjusted, this adjustment being in response to the period of closure of the switches across the primary windings. Accordingly, plural pulse width durations can easily be obtained merely by controlling the closure time of the switches, this being accomplished by applying a low current such as 0.8 mA average gate pulse of about 15 volts to the gate of each FET. The capacitors will recharge after each discharge operation due to the voltage source constantly being coupled thereacross.

The energy produced enters the cathode of a load device, such as a TWT, which is a microwave amplifier, to produce the required amplification in standard manner.

There is also provided a negative high voltage clamp circuit. This circuit can take the form of an adjustable negative high voltage source coupled to the cathode of the travelling wave tube through a diode with an RC circuit coupled between the negative voltage source and reference potential. This permits use of a very low generator impedance with a very high load impedance which causes overshoot. The diode, RC circuit and negative high voltage supply clamp the circuit so that any overshoot energy to the transformer secondary is absorbed in the clamp capacitor of the RC circuit. This allows for a very flat pulse without degrading the rise time of the pulse. It follows that this circuit compensates for overshoot in pulses having a very rapid rise time.

As an alternative, the negative high voltage power supply, which can affect reliability, can be replaced with a switch, preferably in the form of an FET. The FET switch has its source-drain circuit in series with a resistor of the RC circuit with the negative high voltage supply removed from the circuit. The gate of the FET switch is controlled by an external logic driver to adjust the resistance in the RC circuit. The resistor continually bleeds off energy from the capacitor with the rate of bleed-off being a function of the resistance added to the circuit by a controlled FET in series with the resistor. The resistance added by FET the is, in turn, controlled by the voltage on the gate of the FET. Accordingly, when the pulse repetition frequency (PRF) and/or the pulse width are being changed, the voltage on the gate of the FET is simultaneously changed to accommodate such change in PRF and pulse width and provide the desired peak value of voltage on the cathode of the travelling wave tube. This capacitive clamp filters out ripple as well as the overshoot.

DESCRIPTION OF THE PREFERRED EMBODIMENTS

Figure 1:
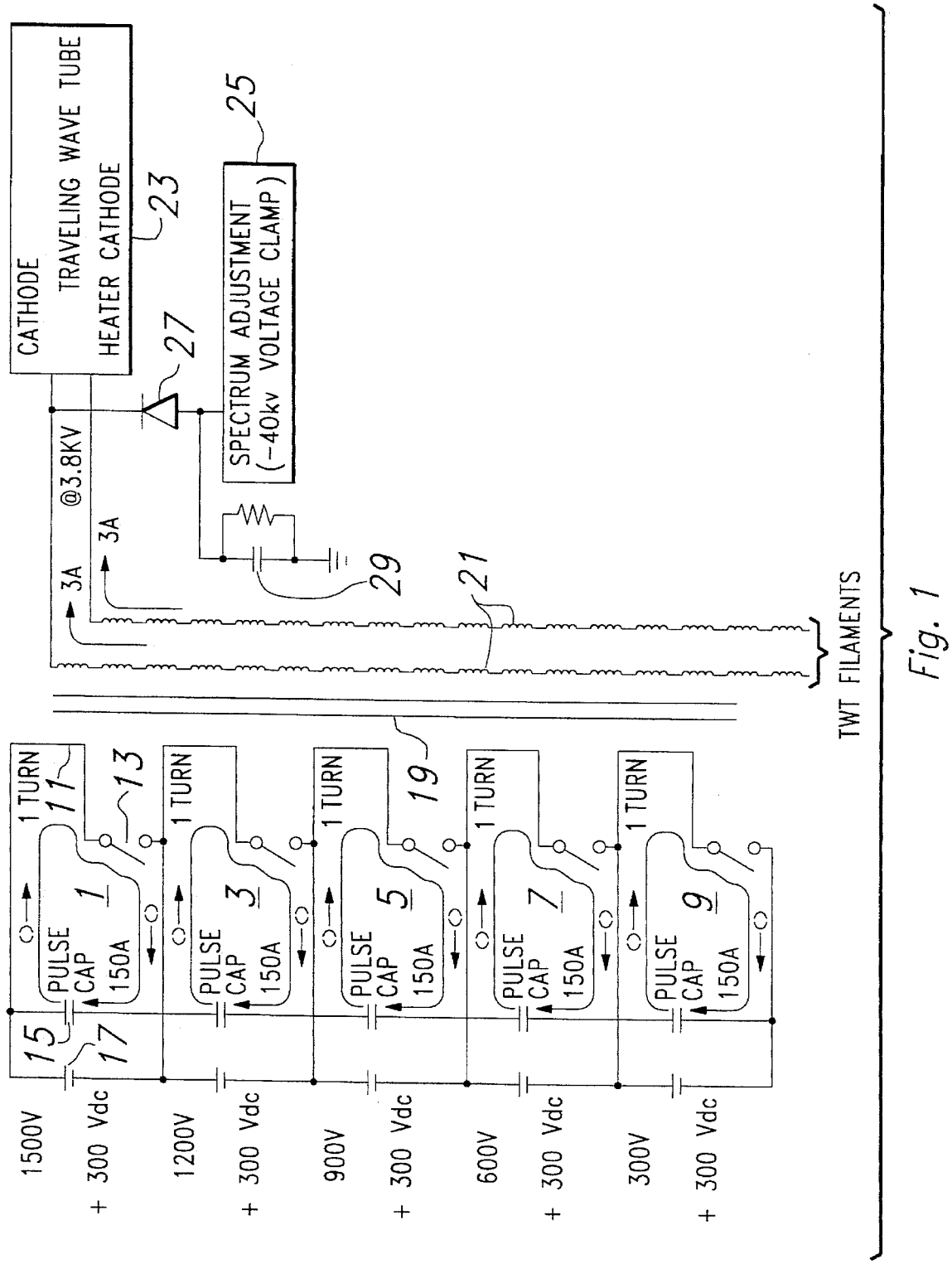
FIG. 1 is a circuit diagram of an electronic pulse transformer circuit for a travelling wave tube in accordance with the present invention.

Referring first to FIG. 1, there is shown an electronic pulse transformer circuit in accordance with the present invention driving a travelling wave tube. The pulse transformer circuit includes a plurality of individual primary circuits 1, 3, 5, 7 and 9, each primary circuit including a transformer primary winding of one turn 11 coupled to a switch 13. The switch 13 is preferably a FET with switch opening and closure responsive to the application of a low voltage (about 15 volts) pulse of predetermined duration to the gate of the FET as will be explained hereinbelow. The duration of switch closure is directly related to the duration of application of the low voltage to the gate of the FET switch 13. A capacitor 15 is coupled across the single turn primary winding 11 and the switch 13 and a separate source of DC voltage 17, 300 volts in the example as shown, is coupled across each capacitor 15.

Each of the primary windings 11 is coupled to a toroidal core 19 to apply flux thereto in response to current flow through the primary winding. A secondary winding 21 composed of a plurality of turns (130 in the specific example to provide a 26:1 turns ratio from primary to secondary) is coupled to the toroidal core 19 with the voltage developed across the secondary winding being applied to the heater cathode of a travelling wave tube 23.

There is also provided a negative high voltage clamp circuit which includes a −40 kV voltage clamp 25 in the preferred embodiment. This circuit can take the form of an adjustable negative high voltage source 25 coupled to the cathode of the travelling wave tube 23 through a diode 27 with an RC circuit 29 coupled between the negative voltage source and reference potential. This permits use of a very low generator impedance with a very high load impedance which causes overshoot. The diode 27, RC circuit 29 and negative high voltage supply 25 clamp the circuit so that any overshoot energy is absorbed in the clamp capacitor of RC circuit 29. This allows for a very flat pulse without degrading the rise time of the pulse. It follows that this circuit compensates for overshoot in pulses having a very rapid rise time.

Figure 3:
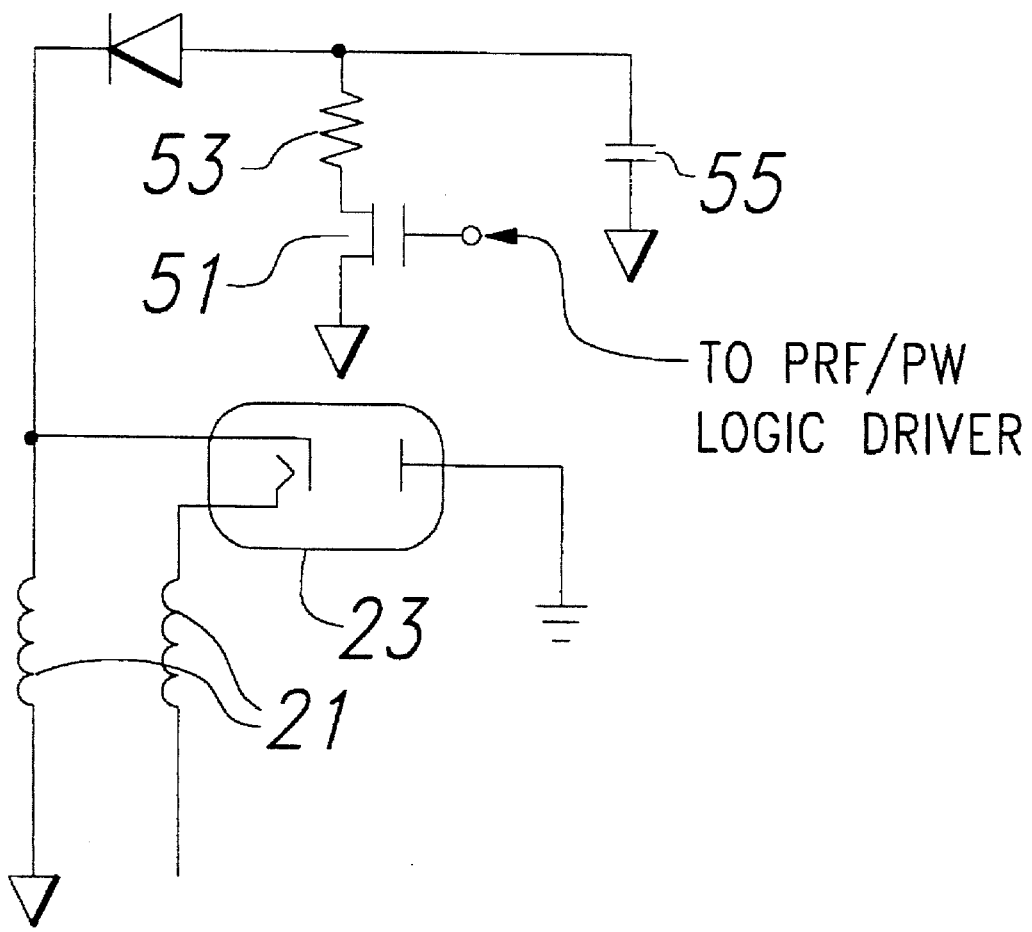
FIG. 3 is a circuit diagram of an alternate clamp circuit in accordance with the present invention.

As an alternative, with reference to FIG. 3, the power supply 25, which can affect reliability, can be replaced with a switch in the form of an FET 51. The switch 51 has its source-drain circuit in series with the resistor 53 of the RC circuit 29 with the supply 25 removed from the circuit. The gate of switch 51 is controlled by an external pulse repetition frequency/ pulse width (PRF/PW) logic driver. The resistor 53 continually bleeds off the energy from the capacitor 55 due to the charge thereon with the rate of bleed-off being a function of the resistance added to the circuit by the FET 51. The resistance added by FET 51 is, in turn, controlled by the voltage on the gate thereof. Accordingly, when PRF and PW are being changed, the voltage on the gate of FET 51 is simultaneously changed to accommodate such change and provide the desired peak value of voltage on the cathode of the travelling wave tube 23. This capacitive clamp filters out ripple as well as the overshoot as described hereinabove.

In operation, the capacitors 15 are initially fully charged by the DC voltage source 17. The switches 13 are all simultaneously closed by applying a voltage the gates of the FETs which constitute the switches. The duration of switch closure is directly related to the duration of application of the voltage to the gates of the FETs. Upon closure of the switches 13, the capacitors 15 commence partially discharging through the one turn primary windings 11 and provide a flux in the core 21 of the pulse transformer from each of the primary windings. The amount of capacitor discharge is based upon the duration of discharge. In general, the capacitors 15 will discharge to about 98% to about 95% of their full charge in normal operation. This flux is applied to the secondary winding 21 which provide a multiplication of the sum of the voltages across the primary windings and apply this voltage to the cathode of the travelling wave tube 23.

Figure 2:
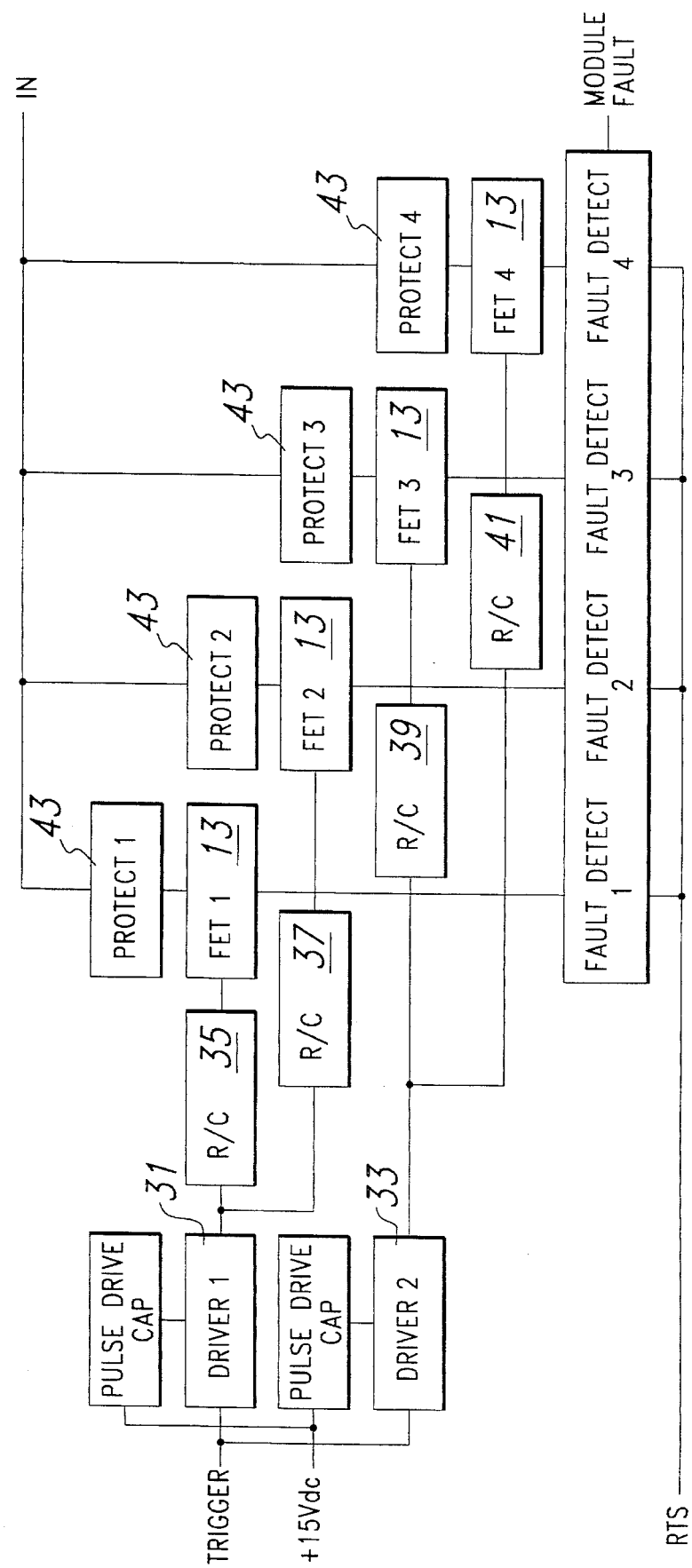
FIG. 2 is a circuit diagram of the FET module block for use in the present invention.

Referring to FIG. 2, there is shown a circuit diagram of the operation of each of the FETs 13, only four such FETs being shown though five FETs appear in FIG. 1. A trigger signal actuates a pair of drivers 31 and 33, the driver 31 providing a pulse to FET 1 through RC circuit 35 and to FET 2 through RC circuit 37. The RC circuits 35, 37, 39 and 41 are generally a resistor in series with the driver and FET gate with a capacitor in parallel with the resistor. The driver 33 provides a pulse to FET 3 through RC circuit 39 and to FET 4 through RC circuit 41. Each of the FETs 1 through 4 has a protect circuit 43 in series with the source-drain circuit thereof to protect against burnout due to an overcurrent or overvoltage thereacross. The protect circuit 43 is generally a fuse in the drain of the FET. Also disposed in the source-drain circuit of each FET 1 through 4 is an optional fault protect circuit which opens that circuit in the event a fault is sensed in the module.

It can be seen that there has been provided a pulse transformer having relatively low voltage operation which is solid state and performs the functions of hydrogen thyratrons without the problems inherent in hydrogen thyratrons.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modification.

I claim:

1. A circuit which comprises:
  (a) a load circuit having a voltage of predetermined polarity with potential overshoot periodically applied thereto; and
  (b) a clamp circuit which includes:
    (i) a voltage source of opposite polarity to the direction of said potential voltage overshoot coupled through a unidirectional current conducting device between said load circuit and a source of reference potential; and
    (ii) an RC circuit connected in parallel with said voltage source of opposite polarity to the direction of said voltage overshoot and said unidirectional current conducting device.

2. A circuit which comprises:
  (a) a load circuit having a voltage of predetermined polarity with potential overshoot periodically applied thereto;

(b) a voltage source of opposite polarity to the direction of said potential voltage overshoot coupled between said load circuit and a source of reference voltage; and (c) an RC circuit coupled between said load circuit and said source of reference potential, said RC circuit including:
  (i) a capacitor; and
  (ii) a variable resistance circuit in parallel with said capacitor.

3. A circuit which comprises:

(a) a load circuit having a voltage of predetermined polarity with potential overshoot periodically applied thereto; and (b) an RC circuit coupled through a unidirectional current conducting device between said load circuit and a source of reference potential, said RC circuit including:
  (i) a capacitor; and
  (ii) a variable resistance circuit in parallel with said capacitor wherein said variable resistance circuit includes a fixed resistance and a variable resistance connected in series.

4. The circuit of claim 3 where said variable resistance is a semiconductor device having a control electrode and a current carrying path controlled by said control electrode.

5. A circuit which comprises:

(a) a load circuit having a voltage of predetermined polarity with potential overshoot periodically applied thereto; and (b) an RC circuit coupled through a unidirectional current conducting device between said load circuit and a source of reference potential, said RC circuit including:
  (i) a capacitor; and
  (ii) a variable resistance circuit in parallel with said capacitor where said variable resistance includes a semiconductor device having a control electrode and a current carrying path controlled by said control electrode.

* * * * *